United States Patent
Xiong et al.

(10) Patent No.: US 9,006,020 B2
(45) Date of Patent: Apr. 14, 2015

(54) METHOD AND SYSTEM OF PROVIDING DOPANT CONCENTRATION CONTROL IN DIFFERENT LAYERS OF A SEMICONDUCTOR DEVICE

(71) Applicant: First Solar, Inc., Perrysburg, OH (US)

(72) Inventors: Gang Xiong, Santa Clara, CA (US);
Rick C. Powell, Ann Arbor, MI (US);
Xilin Peng, Bloomington, MN (US);
John Barden, Ottawa Hills, OH (US);
Arnold Allenic, Ann Arbor, MI (US);
Feng Liao, Perrysburg, OH (US);
Kenneth M. Ring, Waterville, OH (US)

(73) Assignee: First Solar, Inc., Perrysburg, OH (US)

( * ) Notice: Subject to any disclaimer, the term of this patent is extended or adjusted under 35 U.S.C. 154(b) by 37 days.

(21) Appl. No.: 13/739,183

(22) Filed: Jan. 11, 2013

(65) Prior Publication Data
US 2013/0183794 A1    Jul. 18, 2013

Related U.S. Application Data

(60) Provisional application No. 61/585,708, filed on Jan. 12, 2012.

(51) Int. Cl.
*H01L 31/18* (2006.01)
*H01L 21/02* (2006.01)
*H01L 31/0296* (2006.01)
*H01L 31/073* (2012.01)

(52) U.S. Cl.
CPC .......... *H01L 31/18* (2013.01); *H01L 21/02551* (2013.01); *H01L 21/02568* (2013.01); *H01L 21/02573* (2013.01); *H01L 21/0262* (2013.01); *H01L 31/02963* (2013.01); *H01L 31/073* (2013.01); *Y02E 10/543* (2013.01)

(58) Field of Classification Search
None
See application file for complete search history.

(56) References Cited

U.S. PATENT DOCUMENTS

| | | | |
|---|---|---|---|
| 4,632,710 A | 12/1986 | Van Rees | |
| 4,735,822 A | 4/1988 | Ohtoshi et al. | |
| 5,102,694 A * | 4/1992 | Taylor et al. | 427/162 |
| 5,516,724 A * | 5/1996 | Ast et al. | 438/541 |
| 5,582,771 A * | 12/1996 | Yoshimaru et al. | 252/519.53 |
| 5,725,672 A | 3/1998 | Schmitt et al. | |
| 7,053,009 B2 | 5/2006 | Conley et al. | |
| 7,179,677 B2 | 2/2007 | Ramanathan et al. | |
| 7,253,084 B2 | 8/2007 | Todd et al. | |
| 7,491,431 B2 | 2/2009 | Chiruvolu et al. | |
| 7,638,161 B2 | 12/2009 | Mukai et al. | |
| 7,858,510 B1 | 12/2010 | Banerji et al. | |
| 7,951,637 B2 | 5/2011 | Weidman et al. | |
| 7,989,329 B2 | 8/2011 | Ramaswamy et al. | |

(Continued)

FOREIGN PATENT DOCUMENTS

WO    WO 2011/043414 A1    4/2011

OTHER PUBLICATIONS

U.S. Appl. No. 13/601,512.

(Continued)

*Primary Examiner* — Charles Garber
*Assistant Examiner* — Stanetta Isaac
(74) *Attorney, Agent, or Firm* — Dickstein Shapiro LLP (57) ABSTRACT

A method and system for controlling the amount of a second material incorporated into a first material by controlling the amount of a third material which can interact with the second material.

25 Claims, 4 Drawing Sheets

(56) References Cited

U.S. PATENT DOCUMENTS

| | | | |
|---|---|---|---|
| 7,993,752 B2 | 8/2011 | Appadurai | |
| 8,008,208 B2 | 8/2011 | Stewart et al. | |
| 8,580,697 B1* | 11/2013 | Lang et al. | 438/761 |
| 2006/0194422 A1* | 8/2006 | Cardone et al. | 438/542 |
| 2008/0264332 A1 | 10/2008 | Sepehry-Fard | |
| 2009/0233424 A1 | 9/2009 | Ye | |
| 2009/0263956 A1* | 10/2009 | Amirav | 438/478 |
| 2010/0170443 A1* | 7/2010 | Pei | 118/726 |
| 2010/0178435 A1* | 7/2010 | Ervin et al. | 427/569 |
| 2010/0261340 A1 | 10/2010 | Nijhawan et al. | |
| 2011/0041917 A1 | 2/2011 | Dauson | |
| 2011/0114937 A1 | 5/2011 | Nakahara et al. | |
| 2011/0139240 A1 | 6/2011 | Allennic | |
| 2011/0206846 A1 | 8/2011 | Elam et al. | |
| 2011/0278702 A1 | 11/2011 | Horzel et al. | |
| 2012/0205652 A1 | 8/2012 | Ohmi et al. | |
| 2012/0240989 A1* | 9/2012 | Ramanathan et al. | 136/255 |
| 2013/0118564 A1* | 5/2013 | Cheung et al. | 136/252 |

OTHER PUBLICATIONS

U.S. Appl. No. 61/530,655.

\* cited by examiner

METHOD AND SYSTEM OF PROVIDING DOPANT CONCENTRATION CONTROL IN DIFFERENT LAYERS OF A SEMICONDUCTOR DEVICE

CLAIM OF PRIORITY

This application claims priority under 35 U.S.C. §119(e) to U.S. Provisional Patent Application Ser. No. 61/585,708 filed on Jan. 12, 2012, which is hereby incorporated by reference in its entirety.

TECHNICAL FIELD

Disclosed embodiments relate generally to semiconductor devices, and more particularly, to a system and method of providing dopant concentration control in different layers of a photovoltaic device.

BACKGROUND

Photovoltaic devices such as photovoltaic modules or cells can include a plurality of layers of materials deposited on a substrate using various deposition systems and techniques. Some of the layers may have to be doped at times to enhance their electrical properties and characteristics. However, the actual amount of dopant used to dope the layers is very critical. For example, a certain amount of dopant concentration may enhance the electrical properties of a layer while another concentration of the dopant may severely decrease those electrical properties. Hence, a need exists for a method and system for controlling dopant concentration in a layer of material of a photovoltaic device.

DETAILED DESCRIPTION

In the following detailed description, reference is made to the accompanying drawings which form a part hereof, and in which is shown by way of illustration specific embodiments that may be practiced. These embodiments are described in sufficient detail to enable those skilled in the art to make and use them, and it is to be understood that structural, logical, or procedural changes may be made to the specific embodiments disclosed without departing from the spirit and scope of the invention.

Embodiments described herein provide a system and method of controlling concentration of a second material (dopant material, e.g., silicon) in manufacturing a photovoltaic device. The method and system control an amount of dopant material which dopes a first material for deposition (e.g., cadmium telluride) by having a third material (or reacting agent, e.g., an oxidizing agent such as oxygen or water vapor) react with the dopant material. The dopant material may include silicon, germanium or other dopant material. In the following description, control of a silicon dopant used to dope thin film semiconductor layers, e.g., cadmium sulfide and cadmium telluride, of a photovoltaic device will be described. However, the methods and systems described herein may be used more generally to provide dopant control for any suitable deposited layer or film on a substrate.

Figure 1:
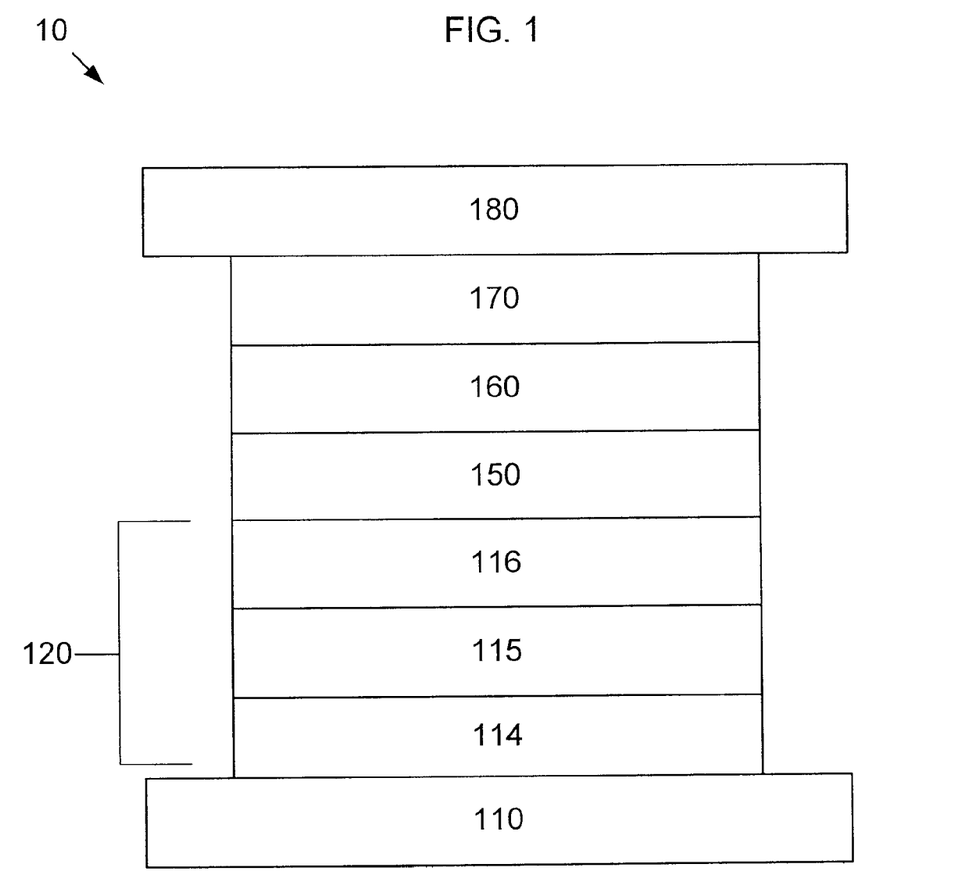
FIG. 1 is a schematic of a photovoltaic device having multiple layers.

Referring to FIG. 1, by way of example, a photovoltaic device 10 can be formed by sandwiching a plurality of sequentially formed layers of materials between two support/protection layers (substrate 110 and back support layer 180 both of which may be made of glass). In construction, barrier layer 114 may be deposited on substrate 110. Upon the barrier layer 114, transparent conductive oxide (TCO) layer 115, buffer layer 116, semiconductor window layer 150, semiconductor absorber layer 160, back contact layer 170 and back support 180 may be sequentially deposited.

In some instances, barrier layer 114, TCO layer 115 and buffer layer 116 may be formed separately and deposited as a stack of layers upon substrate 110. For this reason, barrier layer 114, TCO layer 115 and buffer layer 116 are often referred to as a TCO stack labeled herein TCO stack 120.

Barrier layer 114 is used to protect semiconductor layers 150 and 160 from potential contaminants that may be generated by substrate 110 during construction as well as while the device is in operation. TCO layer 115 and back contact layer 170 are used as electrodes to provide power generated by the photovoltaic device to externally connected electrical devices. Buffer layer 116 is used to lessen any ill effects that irregularities developed during the deposition of semiconductor layers 150 and 160 may have on the device.

Semiconductor 150 and 160 facilitate the conversion of light to electricity. Specifically, window semiconductor 150 is an n-type semiconductor layer while absorber semiconductor layer 160 is a p-type semiconductor layer. The interface between the two semiconductors forms a p-n junction where conversion of light to electricity occurs.

It has been found desirable to incorporate dopants in semiconductor window layer 150 and absorber layer 160. For example, the incorporation of silicon as a dopant into cadmium sulfide (the material used to form semiconductor window layer 150 in this example) and cadmium telluride (the material used to form semiconductor absorber layer 160) is found to promote better growth of the cadmium telluride on the cadmium sulfide by improving their crystalline structures (i.e., arrangement of atoms and/or molecules in the materials). Tests have revealed that a silicon concentration in the range of about 0.0001% to about 5% in the cadmium telluride layer 160 and the cadmium sulfide layer 150 increases both light transmission through the cadmium sulfide layer 150 and photon absorbance by the cadmium telluride layer 160. Therefore, it is desirable to control the concentration of silicon dopant within the semiconductor layers 150, 160 such that the semiconductor layers 150 and 160 in the resulting photovoltaic device have the correct amount of dopant concentration.

Precise silicon dopant concentration control during deposition of semiconductor layers 150, 160 using current vapor transport deposition (VTD) systems and methods is difficult. Examples of current VTD systems can be found in U.S. Pat. Nos. 5,945,163, 5,945,165, 6,037,241, and 7,780,787, all assigned to First Solar, Inc. A VTD system may use a powder delivery unit, a powder vaporizer and vapor distributor, and a vacuum deposition unit. VTD powder vaporizers are designed to vaporize or sublimate raw material powder into a gaseous form. In conventional powder vaporizers, raw material powder combined with a carrier gas is injected into a permeable heated cylinder from a powder delivery unit. The material is vaporized in the cylinders and the vaporized material diffuses through the permeable walls of the vaporizer into the distributor. The distributor collects and directs the flow of vaporized raw material for deposition as a thin film layer on a substrate. The distributor typically surrounds the vaporizer cylinder and directs collected vapors toward openings which face toward a substrate.

Controlling dopant concentration using current VTD systems and methods may be difficult for several reasons. First, most of the silicon dopant-containing materials are in a solid phase (e.g., powder form). For example, for cadmium telluride and cadmium sulfide deposition, respective raw material powders containing cadmium telluride and silicon and cadmium sulfide and silicon are used. Adjusting the powder composition balance of a semiconductor material-dopant powder mixture requires time-consuming and costly VTD system shutdowns. For example, if the semiconductor layer 150 or 160 has a silicon concentration outside the range of about 0.0001% to about 5%, the VTD system shutdowns may be required to adjust the silicon concentration in the semiconductor material-dopant powder mixture, which slows processing time. An increase in system shutdowns results in an undesirable increase in raw material and production costs.

Second, although some silicon-containing gas phase dopant materials such as silane ($SiH_4$) can be used instead of a powder, their applications typically require special chemical handling procedures, equipment, and safety pre-cautions, due to high-toxicity and inflammability. $SiH_4$ is highly inflammable and could cause an explosion if not properly stored and handled, as described in Asia Industrial Gases Association (AIGA), "Storage And Handling Of Silane And Silane Mixtures," AIGA 052/08.

Moreover, at high temperatures of between about 450° C. and about 800° C., which occur during cadmium telluride and cadmium sulfide deposition, silicon integral to various components of deposition vessels, such as a heaters, ceramics, or process vessels, may be liberated and react with the gas phase deposition material. For example, deposition of silicon-doped cadmium telluride may involve depositing a gaseous mixture of $SiTe_x$, cadmium and tellurium onto a substrate. At such temperatures, the silicon present within deposition vessels can react with tellurium to form excess $SiTe_x$, which may be incorporated into the cadmium telluride layer. Likewise, deposition of silicon-doped cadmium sulfide may involve depositing a gaseous mixture of $SiS_x$, cadmium and sulfide onto a substrate. At high temperatures, the silicon present within or on deposition vessels can react with sulfur to produce unwanted $SiS_x$ which may be incorporated into the cadmium sulfide layer. Therefore, the silicon present within deposition vessels may increase expected dopant concentrations in the deposited material and impair photovoltaic device performance, for example silicon concentrations of greater than about 5% in a deposited cadmium telluride or cadmium sulfide material layer.

In a first embodiment, a method and system control an amount of a dopant material with which to dope a material for deposition, e.g., cadmium telluride, by having an oxidizing agent, such as, for example, oxygen or water vapor, react with the dopant material in a second chamber which houses a first chamber. A second embodiment is similar to the method and system of the first embodiment except that the dopant material may react with the oxidizing agent in the first chamber.

Figure 2:
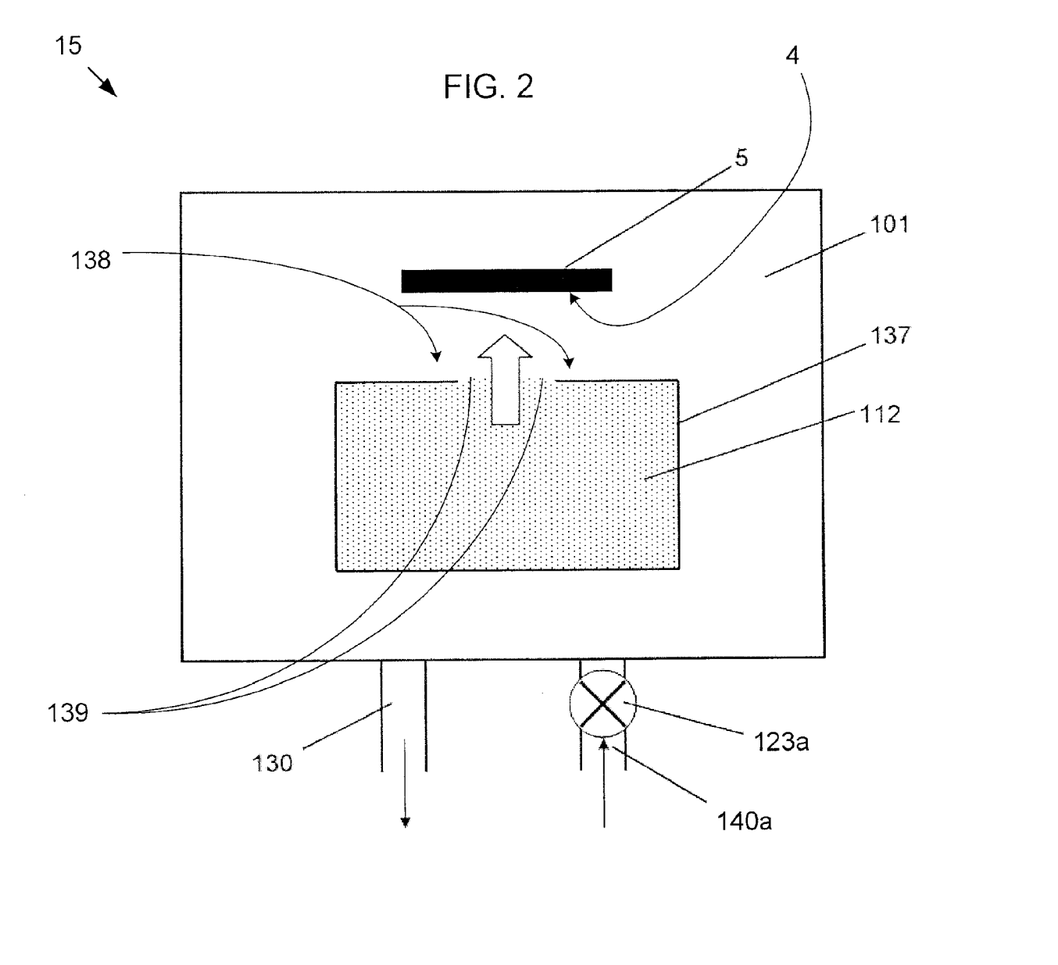
FIG. 2 is a schematic of a deposition system providing for dopant material concentration control according to a first embodiment.

FIG. 2 illustrates a first embodiment of a deposition system 15 for controlling the amount of dopant material with which to dope a cadmium telluride layer deposited on a substrate 5. Note that in this particular case, substrate 5 will already have cadmium sulfide layer 150 and TCO stack 120 deposited thereon. In this exemplary embodiment, oxygen is used as a reacting agent to control the amount of the silicon dopant during the deposition of the cadmium telluride layer.

Referring to FIG. 2, deposition system 15 may include a first chamber 112 which is housed in a second chamber 101. The first chamber 112 is in vapor (or fluid) communication with the second chamber 101. First chamber 112 may include any vapor transport deposition system known in the art. Silicon dopant may be incorporated into the deposited materials in any suitable manner, including, for example, by mixing silicon powder into the powder of the material to be deposited, as described below. A deposition zone within the second chamber 101 proximate to one or more openings 139 in the first chamber 112 is configured to receive substrate 5. Substrate 5 is received and positioned inside second chamber 101 such that it receives vapor output from first chamber 112 through one or more openings 139.

Chamber 112 contains a cadmium telluride semiconductor material powder and a silicon dopant powder combined as a silicon-cadmium telluride powder mixture. The mixture is vaporized and reacts to form a gaseous mixture of $SiTe_x$, cadmium and tellurium. The gaseous mixture exits the chamber 112 through openings 139 and enters into the second chamber 101. There, as shown in the chemical reaction below, the $SiTe_x$ gas reacts with oxygen ($O_2$) to yield solid-phase silicon dioxide ($SiO_2$) and tellurium ($x/2Te_2$):

$$SiTe_{x(g)} + O_{2(g)} \rightarrow SiO_{2(s)} + x/2Te_{2(g)}$$

The resulting solid phase $SiO_2$ which is formed will be deposited in the second chamber 101 as opposed to being a vapor phase material which can be deposited onto the substrate 5.

Generally, in a 0.1 mol cadmium telluride, 0.00015 mol silicon, and 0.0001 mol oxygen gas mixture, it is desirable to use 0.00005 mol silicon (0.05% concentration in cadmium telluride) to dope the cadmium telluride deposited on the substrate 5. The remaining 0.0001 mol silicon can be converted into silicon dioxide through the above reaction. Therefore, it is necessary to control the amount of silicon dioxide generated by limiting the amount of oxygen in the system. By adjusting the oxygen ratio in the second chamber 101 during material growth, silicon doping concentration can be controlled. Thus, in system 15 of FIG. 2, oxygen as a reacting agent is effectively used to isolate any unused silicon dopant, so that it is not incorporated into the deposited cadmium telluride film or at the very least is incorporated to such a low extent as to not adversely impact performance of the photovoltaic device.

If first chamber 112 is positioned above the substrate 5 and the gaseous mixture of $SiTe_x$, cadmium and tellurium flows downwardly toward the substrate 5 from first chamber 112, some $SiO_2$ may inadvertently deposit on the substrate 5. In FIG. 2, to ensure that $SiO_2$ is not deposited on the substrate 5, first chamber 112 is positioned below substrate 5. In this configuration, the gaseous mixture of $SiTe_x$, cadmium and tellurium flows upwardly from first chamber 112 through one or more openings 139 toward bottom surface 4 of substrate 5. The heavier solid phase $SiO_2$ will aggregate and condense faster than vapor phase material such as $SiTe_x$ and CdTe. Hence, the heavier solid phase $SiO_2$ produced as a result of the reaction between $SiTe_x$ and $O_2$ will settle on portions 138 of exterior wall 137 of the first chamber 112 before reaching the substrate 5. Note that, a constant flow of the gaseous mixture of $SiTe_x$, cadmium and tellurium from first chamber 112 (illustrated by the arrow in FIG. 2) will partially block solid phase $SiO_2$ from falling through one or more openings 139 and settling inside first chamber 112.

Referring again to FIG. 2, the second chamber 101 may comprise an outlet 130 and a first reactant inlet 140a. The concentration of oxygen in the second chamber 101 is adjusted via mass flow controller 123a. Outlet 130 may comprise or be in fluid communication with a vacuum pump system configured to evacuate second chamber 101 of gases, including oxygen, contained therein.

First mass flow controller 123a may be adjusted manually or automatically by a computer system and may be connected to a system or network, and may be adjusted as needed to ensure that the proper amount of oxygen is being used in the deposition process.

As is well known in chemistry, the reaction of $SiTe_x$ and oxygen in the second chamber 101 may also be controlled by adjusting the system's temperature and/or pressure. In such instance, the temperature of the system 15 may be anywhere from about 20° C. to about 1500° C. Altering the temperature can induce an equilibrium shift of the chemical reaction $SiTe_{x(g)}+O_{2(g)} \rightarrow SiO_{2(s)}+x/2Te_{2(g)}$. It may also change the sticking coefficient of $SiTe_x$ on the substrate 5, that is, the ratio of the number of $SiTe_x$ molecules that adsorb, or stick to the deposited cadmium telluride, to the total number of $SiTe_x$ molecules that contact the deposited cadmium telluride, which can alter the silicon concentration in the deposited cadmium telluride.

The oxygen partial pressure in the second chamber 101 may be adjusted through the use of first reactant inlet 140a and outlet 130, as described above. Oxygen may be injected into the system 15 at any suitable pressure that provides for the desired silicon dopant concentration in the cadmium telluride material deposited on substrate 5. For example, oxygen may be injected into the system 15 at a pressure of more than about 1 torr, more than about 3 torr, more than about 5 torr, less than about 20 torr, less than about 15 torr, less than about 10 torr, or less than about 7 torr.

Figure 3:
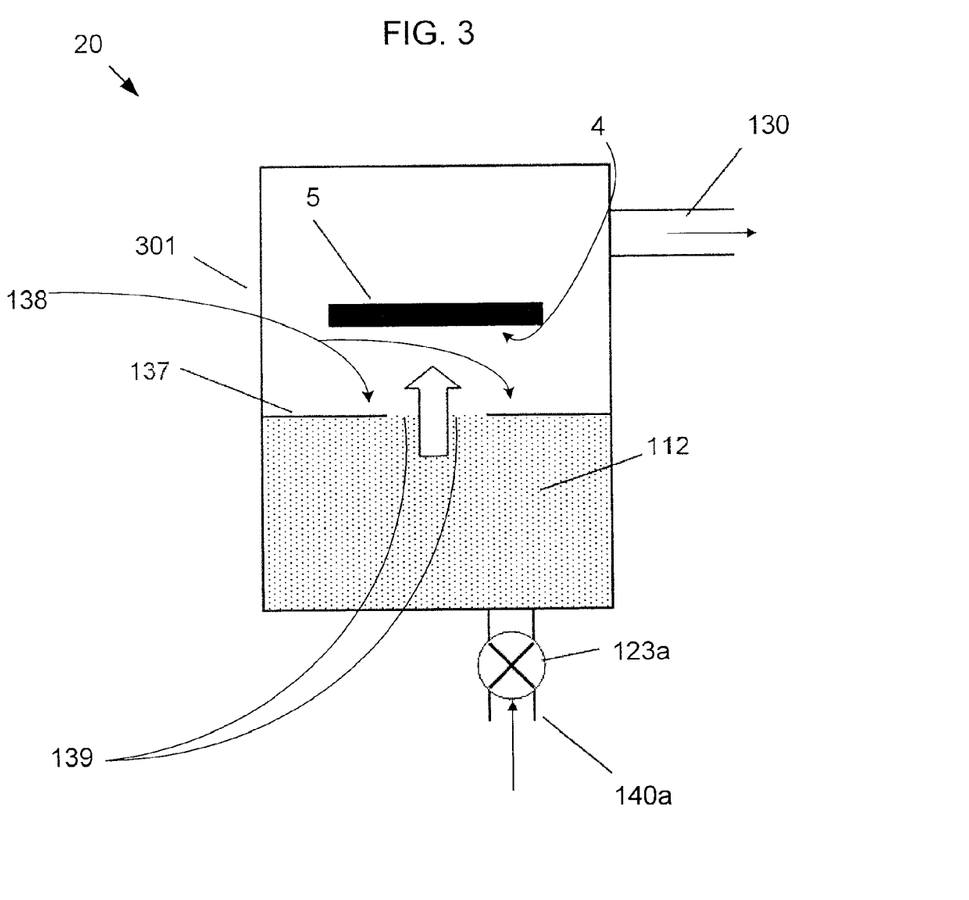
FIG. 3 is a schematic of a deposition system providing for dopant material concentration control according to a second embodiment.

FIG. 3 illustrates a second embodiment of a deposition system 20. This system is similar to the one in FIG. 2, except that the reacting agent, e.g., oxygen, is injected directly into first chamber 112 where the powder mixture of cadmium telluride semiconductor material, silicon dopant and silicon-cadmium telluride is vaporized.

Consequently, the oxygen reacts with the $SiTe_x$ vapor inside first chamber 112 rather than in second chamber 101 as in FIG. 2. Similar to the system in FIG. 2, however, the amount of $SiTe_x$ vapor that can be transported from the first chamber 112 to substrate 5 in the second chamber 301 is limited by the amount of oxygen in first chamber 112.

Figure 4:
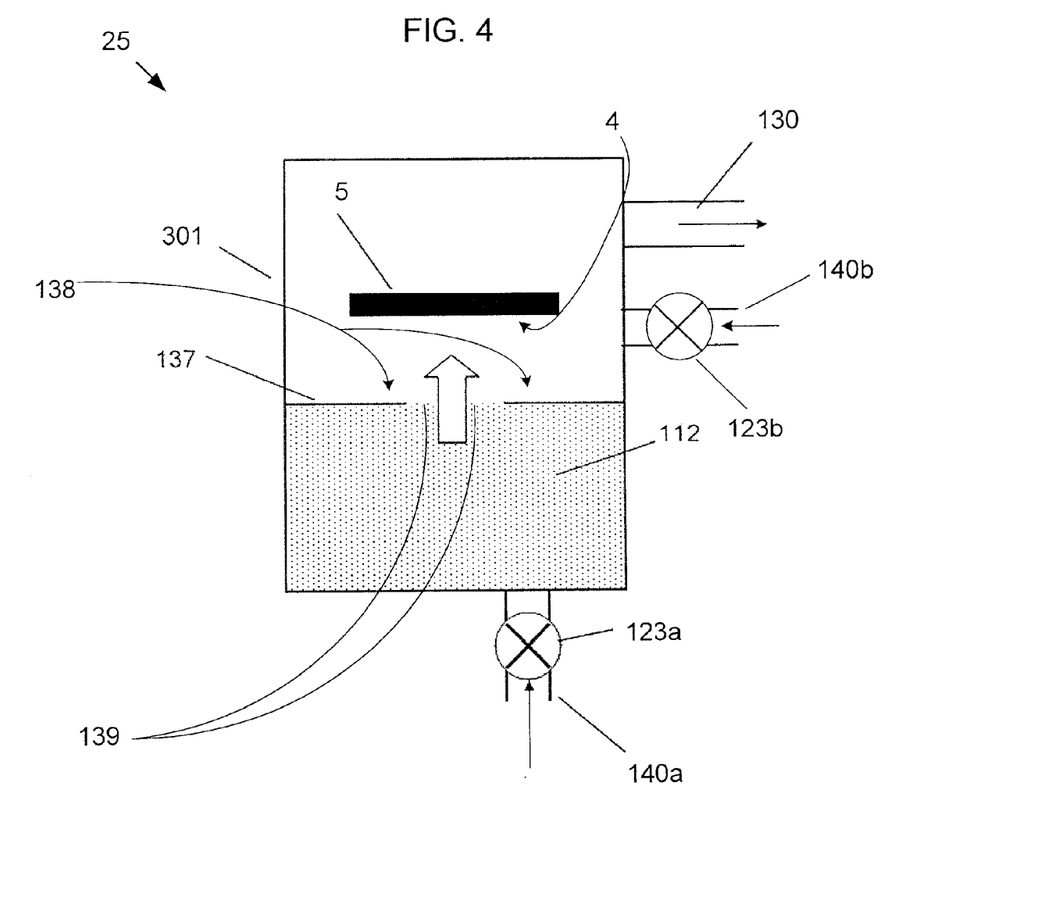
FIG. 4 is a schematic of a deposition system providing for dopant material concentration control according to a third embodiment.

FIG. 4 illustrates a third embodiment of a deposition system 25 that is similar to system 15 in FIG. 3. In FIG. 4, additional reacting agents may flow into the second chamber 301 through one or more second reactant inlets 140b, which may be regulated by a second mass flow controller 123b. Additional reacting agents may be the same as, or different than, the reacting agent that flows through the first reactant inlet 140a.

Although the first chamber 112 is positioned below substrate 5 in FIG. 2-4, this is not limiting. First chamber may be positioned above substrate 5 or in any other location suitable for depositing material onto substrate 5 and controlling the dopant concentration in such material.

The materials employed when the FIG. 2-4 embodiments are used for cadmium telluride deposition are not limiting. Systems 15, 20, 25 may be used for deposition of other materials on a substrate including a cadmium sulfide layer, in which a cadmium sulfide semiconductor material powder and a silicon dopant powder can be combined as a silicon-cadmium sulfide powder mixture and then vaporized and reacted in first chamber 112 of FIGS. 2-4 to form a gaseous mixture of $SiS_x$, cadmium and sulfur. The gas phase dopant ($SiS_x$) concentration in the cadmium sulfide layer may be controlled through its reaction with oxygen according to, but not limited to, the following reactions:

$$SiS_{x(g)}+O_{2(g)} \rightarrow SiO_{2(s)}+xS_{(g)}$$

$$SiS_{x(g)}+O_{2(g)} \rightarrow SiO_{2(s)}+SO_{2(g)}$$

The disclosed embodiments may also be used to control dopant levels in other material layers which may be used in photovoltaic or other devices. For example, during manufacturing of a photovoltaic device which includes a copper indium gallium selenide (CIGS) semiconductor material layer, a reacting agent (e.g., oxygen) may be used to control the concentration of silicon dopant in a CIGS material layer via the following exemplary reaction of silicon and selenium:

$$SiSe_{x(g)}+O_{2(g)} \rightarrow SiO_{2(s)}+x/2Se_{2(g)}$$

The FIG. 2-4 embodiments may also be used for deposition of other materials including a transition metal (Group 12) combined with a chalcogenide (Group 18) such as cadmium selenide (CdSe), zinc telluride (ZnTe), zinc selenide (ZnSe) or zinc sulfide (ZnS), or suitable semiconductor alloys such as $Cd_xZn_{1-x}Te$ or $CdTe_xSi_{1-x}$, and their pseudo-binary or ternary compounds. Such deposition materials may include dopants such as silicon or germanium. The embodiments may also be suitable to control dopants used during deposition of other material layers on a substrate, including, for example, silicon material layers such as amorphous silicon (a-Si).

The FIG. 2-4 embodiments may also be used to control incorporation and concentration of various dopants, including, for example, group-IV elements such as silicon, germanium, and their respective compounds. Such dopants may consist of any element or compound having a higher chemical affinity (or reactivity) with the reacting agent than with a base material being deposited.

A variety of reacting agents are available for use in the FIG. 2-4 embodiments, for example, water vapor, nitrogen gas, argon gas or other oxidizing agent, depending on the dopant being controlled and materials with which the dopant may react. Oxidizing agents may be in vapor or liquid phase.

In addition to being used in vapor transport deposition, the methods and systems of the FIG. 2-4 embodiments may also be suitable for various deposition methods and systems, including, for example, close-space sublimation, sputtering, pulse laser deposition, and chemical vapor deposition with appropriate modification of systems.

The deposition systems discussed and depicted herein may be part of a larger system for fabricating a photovoltaic device. Prior to or after encountering deposition system 15, 20, 25 the substrate may undergo various other deposition and/or processing steps to form the various layers shown in FIG. 1, for example.

Also, each layer may in turn include more than one layer or film. Additionally, each layer can cover all or a portion of the device and/or all or a portion of the layer or substrate underlying the layer. For example, a "layer" can include any amount of any material that contacts all or a portion of a surface. It should be noted and appreciated that any of the aforementioned layers may include multiple layers, and that "on" or "onto" does not mean "directly on," such that in some embodiments, one or more additional layers may be positioned between the layers depicted.

The embodiments described above are offered by way of illustration and example. It should be understood that the examples provided above may be altered in certain respects and still remain within the scope of the claims. It should be appreciated that, while the invention has been described with reference to the above example embodiments, other embodiments are within the scope of the claims. It should also be understood that the appended drawings are not necessarily to scale, presenting a somewhat simplified representation of various features and basic principles of the invention.

What is claimed is:

1. A method comprising:
   vaporizing a first material to be deposited on a substrate and a dopant material for doping the first material;
   controlling an amount of the dopant material with which to dope the first material by having the dopant material chemically react with a third material;
   doping the first material with the controlled amount of the dopant material such that only a portion of the dopant material is deposited on the substrate; and
   forming the doped first material on the substrate,
   wherein the third material comprises an oxidizing agent.

2. The method of claim 1, wherein the oxidizing agent comprises oxygen gas.

3. The method of claim 1, wherein the oxidizing agent comprises water vapor.

4. The method of claim 1, wherein the second material comprises silicon.

5. The method of claim 4, wherein the first material has a silicon concentration in the range of about 0.0001% to about 5%.

6. The method of claim 1, wherein the second material comprises germanium.

7. The method of claim 1, wherein the first material comprises one of cadmium sulfide, cadmium telluride, cadmium selenide, zinc telluride, zinc sulfide, zinc selenide, and any pseudo-binary or ternary compounds thereof.

8. A method comprising:
   vaporizing a deposition material which includes a dopant in a first deposition chamber;
   initiating flow of the deposition material which includes the dopant into a second deposition chamber for deposition onto a substrate in the second deposition chamber, the second deposition chamber being in vapor communication with the first deposition chamber;
   dispersing a reacting agent in at least one of the first and second deposition chambers;
   reacting the reacting agent with the dopant in the at least one of the first and second deposition chambers; and
   adjusting flow of the reacting agent to control the amount of dopant incorporated in the deposition material which is deposited on the substrate such that only a portion of the dopant is deposited on the substrate,
   wherein the reacting agent comprises an oxidizing agent.

9. The method of claim 8, wherein the step of dispersing a reacting agent in at least one of the first and second deposition chambers comprises dispersing the reacting agent in the second deposition chamber, and wherein the step of reacting the reacting agent with the dopant in the at least one of the first and second deposition chambers occurs in the second deposition chamber.

10. The method of claim 8, wherein the step of dispersing a reacting agent in at least one of the first and second deposition chambers comprises dispersing the reacting agent in the first deposition chamber, and wherein the step of reacting the reacting agent with the dopant in the at least one of the first and second deposition chambers occurs in the first deposition chamber.

11. The method of claim 10, wherein the step of dispersing a reacting agent in at least one of the first and second deposition chambers comprises dispersing the reacting agent in the second deposition chamber, and wherein the step of reacting the reacting agent with the dopant in the at least one of the first and second deposition chambers occurs in the second deposition chamber.

12. The method of claim 10, further comprising:
    dispersing additional reacting agent in the second deposition chamber; and
    reacting the additional reacting agent in the second deposition chamber.

13. The method of claim 8, wherein the oxidizing agent comprises oxygen gas.

14. The method of claim 8, wherein the oxidizing agent comprises water vapor.

15. The method of claim 8, wherein the dopant comprises silicon.

16. The method of claim 15, wherein the deposited material has a silicon concentration in the range of about 0.0001% to about 5%.

17. The method of claim 8, wherein the dopant comprises germanium.

18. The method of claim 8, wherein the deposition material comprises one of cadmium sulfide, cadmium telluride, cadmium selenide, zinc telluride, zinc sulfide, zinc selenide, and any pseudo-binary or ternary compounds thereof.

19. The method of claim 8, wherein the deposition comprises one of vapor transport deposition, close-space sublimation, sputtering, pulse laser deposition, and chemical vapor deposition.

20. The method of claim 8, further comprising adjusting the temperature of the second deposition chamber.

21. The method of claim 8, further comprising adjusting the flow of the reacting agent into the at least one of the first and second deposition chambers.

22. The method of claim 8, wherein the deposition material further comprises a base material, wherein the reactivity of the dopant for the reacting agent is greater than the reactivity of the dopant for the base material.

23. The method of claim 8, wherein at least one product of the step of reacting the reacting agent with the dopant in the at least one of the first and second deposition chambers comprises one of tellurium gas, sulfur gas, sulfur dioxide gas, and selenium gas.

24. A method comprising:
    vaporizing a deposition material which includes a dopant in a first deposition chamber;
    initiating flow of the deposition material which includes the dopant into a second deposition chamber for deposition onto a substrate in the second deposition chamber, the second deposition chamber being in vapor communication with the first deposition chamber;
    dispersing a reacting agent in at least one of the first and second deposition chambers;
    reacting the reacting agent with the dopant in the at least one of the first and second deposition chambers; and
    adjusting flow of the reacting agent to control the amount of dopant incorporated in the deposition material which is deposited on the substrate such that only a portion of the dopant is deposited on the substrate,
    wherein the step of reacting the reacting agent with the dopant in the at least one of the first and second deposition chambers comprises at least one chemical reaction selected from the group consisting of:

$$SiTe_{x(g)} + O_{2(g)} \rightarrow SiO_{2(s)} + x/2 Te_{2(g)};$$

$$SiS_{x(g)} + O_{2(g)} \rightarrow SiO_{2(s)} + xS_{(g)};$$

$$SiS_{x(g)} + O_{2(g)} \rightarrow SiO_{2(s)} + SO_{2(g)}; \text{ and}$$

$$SiSe_{x(g)} + O_{2(g)} \rightarrow SiO_{2(s)} + x/2 Se_{2(g)}.$$

25. The method of claim 8, wherein the step of reacting the reacting agent with the dopant in the at least one of the first and second deposition chambers comprises at least one chemical reaction selected from the group consisting of:

$$SiTe_{x(g)} + O_{2(g)} \rightarrow SiO_{2(s)} + x/2 Te_{2(g)};$$

$$SiS_{x(g)} + O_{2(g)} \rightarrow SiO_{2(s)} + xS_{(g)};$$

$$SiS_{x(g)} + O_{2(g)} \rightarrow SiO_{2(s)} + SO_{2(g)}; \text{ and}$$

$$SiSe_{x(g)} + O_{2(g)} \rightarrow SiO_{2(s)} + x/2 Se_{2(g)}.$$

* * * * *